United States Patent
Nakayama et al.

(10) Patent No.: US 11,971,458 B2
(45) Date of Patent: Apr. 30, 2024

(54) ELECTRICAL FAULT DETECTION DEVICE AND VEHICLE POWER SUPPLY SYSTEM

(71) Applicant: SANYO Electric Co., Ltd., Osaka (JP)

(72) Inventors: Masato Nakayama, Hyogo (JP); Tomonori Kunimitsu, Hyogo (JP)

(73) Assignee: SANYO Electric Co., Ltd., Osaka (JP)

( * ) Notice: Subject to any disclaimer, the term of this patent is extended or adjusted under 35 U.S.C. 154(b) by 286 days.

(21) Appl. No.: 17/428,013

(22) PCT Filed: Dec. 9, 2019

(86) PCT No.: PCT/JP2019/048019
§ 371 (c)(1),
(2) Date: Aug. 3, 2021

(87) PCT Pub. No.: WO2020/170557
PCT Pub. Date: Aug. 27, 2020

(65) Prior Publication Data
US 2022/0011377 A1    Jan. 13, 2022

(30) Foreign Application Priority Data

Feb. 19, 2019 (JP) .................................. 2019-027442

(51) Int. Cl.
*G01R 31/52* (2020.01)
*B60L 3/00* (2019.01)
*G01R 19/165* (2006.01)

(52) U.S. Cl.
CPC ............ *G01R 31/52* (2020.01); *B60L 3/0046* (2013.01); *B60L 3/0069* (2013.01); *G01R 19/16547* (2013.01)

(58) Field of Classification Search
CPC . G01R 31/52; G01R 19/16547; B60L 3/0046; B60L 3/0069
See application file for complete search history.

(56) References Cited

U.S. PATENT DOCUMENTS 8,791,702 B2 * 7/2014 Miura ................... B60L 3/0069
324/426
11,385,297 B2 * 7/2022 Wakimoto ............. G01R 31/42
(Continued)

FOREIGN PATENT DOCUMENTS

| JP | 2009-109278 A | 5/2009 |
| JP | 2015-226343 A | 12/2015 |
| WO | 2010/143534 | 12/2010 |

OTHER PUBLICATIONS

International Search Report of PCT application No. PCT/JP2019/048019 dated Feb. 4, 2020.
(Continued)

*Primary Examiner* — Alexander Satanovsky
*Assistant Examiner* — Demetrius R Pretlow
(74) *Attorney, Agent, or Firm* — WHDA, LLP

(57) ABSTRACT

In first coupling capacitor, a first terminal is connected to a first connection point on a current path of power storage in a state of being insulated from a ground. Second coupling capacitor has a second terminal connected to a second connection point that is on a current path of power storage and is lower in potential than the first connection point, and second coupling capacitor has a first terminal connected to a second terminal of first coupling capacitor. AC output unit applies a predetermined AC voltage via impedance element to third connection point between the second terminal of first coupling capacitor and the first terminal of second coupling capacitor. Voltage measurement unit measures a voltage at third connection point. Determination unit determines the presence or absence of an electrical fault on the basis of the voltage measured by voltage measurement unit.

3 Claims, 4 Drawing Sheets

(56) References Cited

U.S. PATENT DOCUMENTS

| | | | | |
|---|---|---|---|---|
| 2010/0237872 | A1* | 9/2010 | Kang | H01M 10/42 324/429 |
| 2010/0244849 | A1* | 9/2010 | Yano | G01R 31/52 324/510 |
| 2012/0025844 | A1 | 2/2012 | Morita | |
| 2012/0043967 | A1* | 2/2012 | Miura | B60L 3/0069 324/426 |
| 2012/0206153 | A1* | 8/2012 | Naruse | B60L 3/0069 324/557 |
| 2012/0280697 | A1* | 11/2012 | Morimoto | B60L 3/0069 324/606 |
| 2013/0106320 | A1* | 5/2013 | Yugo | B60L 58/14 318/139 |
| 2014/0049860 | A1* | 2/2014 | Arima | G01R 31/52 361/42 |
| 2014/0145726 | A1* | 5/2014 | Chang | G01R 31/52 324/503 |
| 2015/0293167 | A1* | 10/2015 | Kawamura | B60L 3/0069 324/551 |
| 2016/0091552 | A1* | 3/2016 | Yasukawa | G01R 31/007 324/503 |
| 2017/0131340 | A1* | 5/2017 | Tallam | B60L 3/04 |
| 2017/0197508 | A1* | 7/2017 | Kobayashi | B60L 3/0046 |
| 2017/0299648 | A1* | 10/2017 | Hashimoto | H02H 3/17 |
| 2018/0017609 | A1* | 1/2018 | Terada | H02H 3/04 |
| 2018/0067158 | A1* | 3/2018 | Kawamura | G01R 31/389 |

OTHER PUBLICATIONS

Extended (Supplementary) European Search Report dated Mar. 14, 2022, issued in counterpart EP application No. 19915903.9. (10 pages).

* cited by examiner

ELECTRICAL FAULT DETECTION DEVICE AND VEHICLE POWER SUPPLY SYSTEM

CROSS-REFERENCE TO RELATED APPLICATIONS

This application is a U.S. national stage application of the PCT International Application No. PCT/JP2019/048019 filed on Dec. 9, 2019, which claims the benefit of foreign priority of Japanese patent application No. 2019-027442 filed on Feb. 19, 2019, the contents all of which are incorporated herein by reference.

TECHNICAL FIELD

The present invention relates to an electrical fault detection device that detects a ground fault from a load insulated from a ground, and a vehicle power supply system.

BACKGROUND ART

In recent years, hybrid vehicles (HV), plug-in hybrid vehicles (PHV), and electric vehicles (EV) have become widespread. In these electric vehicles, a high-voltage driving battery (traction battery) is mounted separately from an auxiliary battery (generally, a lead battery having an output of 12V). In order to inhibit electric shock, a high-power circuit including a high-voltage driving battery, an inverter, and a traveling motor is insulated from a body (chassis ground) of the vehicle.

Between positive wiring on the vehicle of the high-power circuit and the chassis ground and between negative wiring on the vehicle of the high-power circuit and the chassis ground, a Y capacitor is individually inserted, to stabilize power supplied from the high-voltage driving battery to the load on the vehicle. There is mounted an electrical fault detection device that monitors an insulation resistance between the high-power circuit and the chassis ground and detects a ground fault.

An AC type electrical fault detection device detects whether or not the current is leaked by applying a pulse voltage to a positive electrode terminal or a negative electrode terminal of a driving battery via a resistor and a coupling capacitor, and measuring a voltage at a connection point between the resistor and the coupling capacitor (see, for example, PTL 1).

CITATION LIST

Patent Literature

PTL 1: International Publication No. 2010/143534

SUMMARY OF THE INVENTION

When it is necessary to increase a capacity of a coupling capacitor, an aluminum electrolytic capacitor is often used as the coupling capacitor. The aluminum electrolytic capacitor can be increased in capacity at low cost as compared with other types of capacitors such as film capacitors and ceramic capacitors.

The aluminum electrolytic capacitor has a property that insulation decreases and a leakage current increases when a no-load state continues for a long period of time. In a state where a contactor between a driving battery and a vehicle load is open, the aluminum electrolytic capacitor used as the coupling capacitor is basically in a no-load state.

The present invention has been made in view of such a situation, and an object of the present invention is to provide a technique for suppressing an increase in leakage current that may occur in a coupling capacitor, in an electrical fault detection device.

In order to solve the above problem, an electrical fault detection device according to an aspect of the present invention includes: a first coupling capacitor including one cell or a plurality of cells connected in series, and having a first terminal connected to a first connection point on a current path of a power storage in a state of being insulated from a ground; a second coupling capacitor having a second terminal connected to a second connection point that is on a current path of the power storage and is lower in potential than the first connection point, and having a first terminal connected to a second terminal of the first coupling capacitor; an AC output unit configured to apply a predetermined AC voltage via an impedance element to a third connection point between the second terminal of the first coupling capacitor and the first terminal of the second coupling capacitor; a voltage measurement unit configured to measure a voltage at the third connection point; and a determination unit configured to determine whether or not the current is leaked on the basis of a voltage measured by the voltage measurement unit.

According to the present invention, in the electrical fault detection device, it is possible to suppress an increase in leakage current that may occur in the coupling capacitor.

DESCRIPTION OF EMBODIMENT

Figure 1:
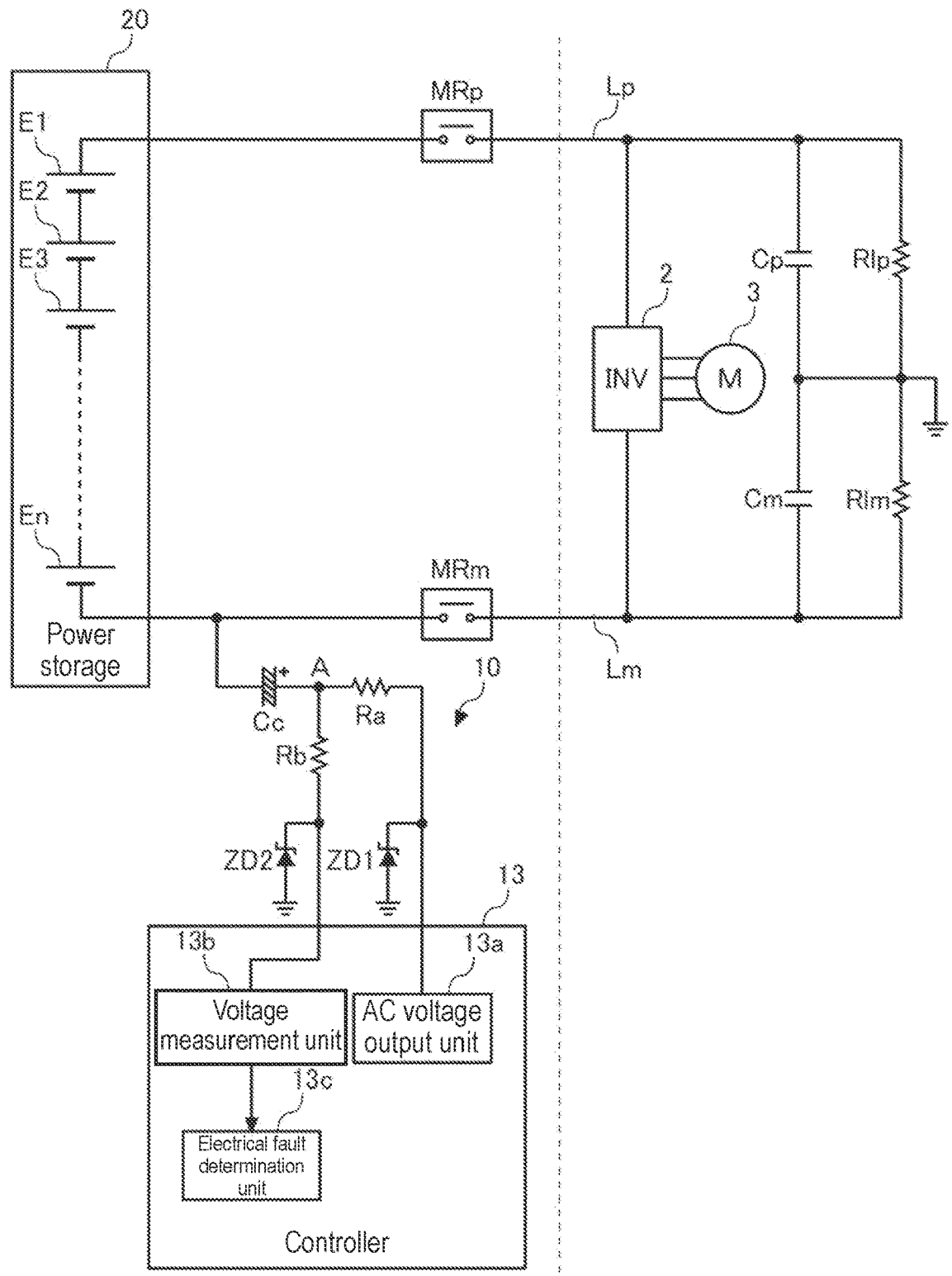
FIG. 1 is a diagram for explaining a configuration of a power supply system including an electrical fault detection device according to Comparative Example 1.

FIG. 1 is a diagram for explaining a configuration of power supply system 5 including electrical fault detection device 10 according to Comparative Example 1. Power supply system 5 is mounted on an electric vehicle. Power supply system 5 is provided separately from an auxiliary battery (typically, a lead battery having an output of 12V is used) in the electric vehicle. Power supply system 5 includes high-voltage power storage 20 and electrical fault detection device 10. Power storage 20 includes a plurality of cells E1 to En connected in series. As the cell, a lithium ion battery cell, a nickel hydrogen battery cell, a lead battery cell, an electric double layer capacitor cell, a lithium ion capacitor cell, or the like can be used. Hereinafter, an example using a lithium ion battery cell (nominal voltage: 3.6 V to 3.7 V) is assumed in the present specification.

The electric vehicle includes inverter 2 and motor 3 as high-voltage loads. A positive electrode of power storage 20 and one end of inverter 2 are connected by positive wiring Lp, and a negative electrode of power storage 20 and another end of inverter 2 are connected by negative wiring Lm. Positive wiring Lp is inserted with positive-side main relay MRp, and negative wiring Lm is inserted with negative-side main relay MRm. Positive-side main relay MRp and negative-side main relay MRm function as contactors that control conduction and disconnection between power storage 20 and a high-voltage load in the electric vehicle. Note that, instead of the relay, a semiconductor switch having a high withstand voltage and a high insulation can be used.

Inverter 2 is a bidirectional inverter connected between power storage 20 and motor 3. At a time of powering, inverter 2 converts DC power supplied from power storage 20 into AC power, and supplies the AC power to motor 3. At a time of regeneration, AC power supplied from motor 3 is converted into DC power and supplied to power storage 20. For example, a three-phase AC motor is used as motor 3. Motor 3 rotates in accordance with AC power supplied from inverter 2 during powering. During regeneration, rotational energy due to deceleration is converted into AC power and supplied to inverter 2.

Power storage 20 is mounted on the electric vehicle in a state of being insulated from a chassis ground of the electric vehicle. The auxiliary battery is mounted on the electric vehicle in a state where a negative electrode is electrically conducted to the chassis ground. Note that positive wiring Lp closer to inverter 2 with respect to positive-side main relay MRp and the chassis ground are connected via positive-side Y capacitor Cp. In addition, negative wiring Lm closer to inverter 2 with respect to negative-side main relay MRm and the chassis ground are connected via negative-side Y capacitor Cm. Positive-side Y capacitor Cp and negative-side Y capacitor Cm have an effect of respectively insulating, in a DC manner, between positive wiring Lp and the chassis ground and between negative wiring Lm and the chassis ground, and stabilizing voltages of positive wiring Lp and negative wiring Lm.

When power storage 20 is ideally insulated from the chassis ground, an intermediate voltage of power storage 20 is maintained around a voltage of the chassis ground. For example, when a voltage across power storage 20 is 400 V, a positive electrode potential of power storage 20 is maintained around +200 V, and a negative electrode potential is maintained around −200 V. In a state where high-voltage power storage 20 and the chassis ground are electrically conducted to each other, there is a risk of electric shock when a human touches an exposed conductor of the electric vehicle. Therefore, in the electric vehicle on which high-voltage power storage 20 is mounted, it is necessary to mount electrical fault detection device 10 and monitor an insulation state between a high-voltage vehicle load including inverter 2 and the chassis ground. In FIG. 1, the insulation state between positive wiring Lp and the chassis ground is represented as positive-side electrical fault resistance Rlp, and the insulation state between negative wiring Lm and the chassis ground is represented as negative-side electrical fault resistance Rlm.

Electrical fault detection device 10 includes coupling capacitor Cc, resistor Ra, and controller 13, as a main configuration. Controller 13 includes AC output unit 13a, voltage measurement unit 13b, and electrical fault determination unit 13c. Controller 13 can include, for example, a microcomputer and a nonvolatile memory (for example, EEPROM or flash memory).

One end of coupling capacitor Cc is connected to a current path of power storage 20. In the example illustrated in FIG. 1, one end of coupling capacitor Cc is connected to the negative electrode of power storage 20. Note that one end of coupling capacitor Cc may be connected to the positive electrode of power storage 20, or may be connected to any node of the plurality of cells E1 to En in power storage 20. Another end of coupling capacitor Cc is connected to an AC output terminal of controller 13 via resistor Ra. Note that, instead of resistor Ra, another impedance element may be used. A connection point (measurement point A) between coupling capacitor Cc and resistor Ra is connected to a measurement voltage input terminal of controller 13 via resistor Rb.

Between the chassis ground and a connection point between resistor Ra and the AC output terminal of controller 13, first Zener diode ZD1 is connected. Between the chassis ground and a connection point between resistor Rb and the measurement voltage input terminal of controller 13, second Zener diode ZD2 is connected. First Zener diode ZD1 and second Zener diode ZD2 inhibit an overvoltage from being applied to controller 13 due to opening and closing of main relays MRp and MRm and load fluctuation of power supply system 5. In addition, controller 13 is protected from surge current and static electricity.

In FIG. 1, as coupling capacitor Cc, an aluminum electrolytic capacitor capable of increasing a capacity at a relatively low cost is used. The aluminum electrolytic capacitor has polarity. In FIG. 1, a positive electrode of the aluminum electrolytic capacitor is connected to measurement point A, and a negative electrode of the aluminum electrolytic capacitor is connected to the negative electrode of power storage 20. Coupling capacitor Cc may be configured by connecting aluminum electrolytic capacitors in series. In this case, even if a short-circuit failure occurs in one capacitor, insulation can be maintained by the remaining capacitor.

AC output unit 13a applies a predetermined AC voltage to another end of coupling capacitor Cc via resistor Ra. AC output unit 13a includes a local oscillator, shapes a rectangular wave pulse generated by the local oscillator into a rectangular wave pulse signal having a preset frequency and duty ratio, and outputs the rectangular wave pulse signal. Voltage measurement unit 13b measures a voltage at measurement point A. Note that, in a case where the A/D converter is not incorporated in controller 13, an A/D converter (not illustrated) is provided between measurement point A and voltage measurement unit 13b, and the A/D converter converts an analog voltage at measurement point A into a digital value and outputs to voltage measurement unit 13b.

Electrical fault determination unit 13c compares the voltage at measurement point A measured by voltage measurement unit 13b with a set value, to determine whether or not the current is leaked. Electrical fault determination unit 13c determines whether or not the current is leaked on the basis of a degree of blunting of the applied rectangular wave pulse signal.

Figure 2:
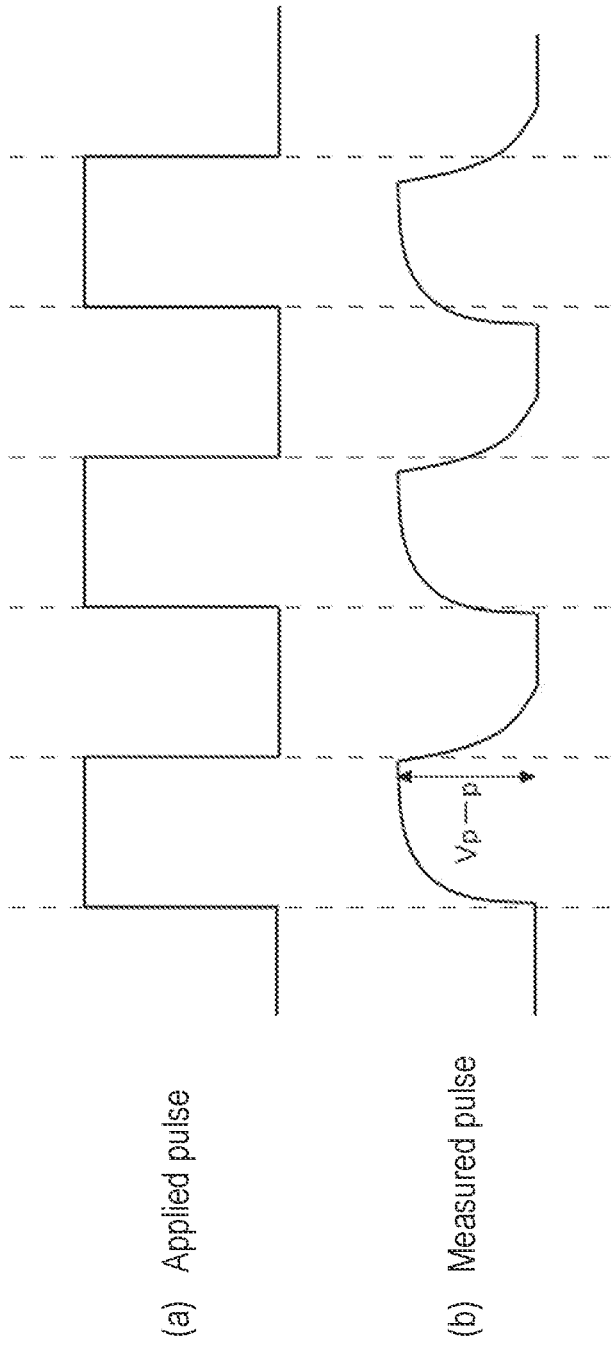
FIGS. 2(a) and 2(b) are views illustrating an example of a rectangular wave pulse waveform applied from an AC output unit to measurement point A, and a voltage waveform at measurement point A measured by a voltage measurement unit.

FIGS. 2(a) and 2(b) are views illustrating an example of a rectangular wave pulse waveform applied from AC output unit 13a to measurement point A, and a voltage waveform at measurement point A measured by voltage measurement unit 13b. Electrical fault determination unit 13c calculates differential voltage Vp-p between a voltage at measurement point A sampled at a timing immediately before a rising edge of the applied rectangular wave pulse waveform, and a voltage at measurement point A sampled at a timing immediately before a falling edge of the applied rectangular wave pulse waveform. When calculated differential voltage Vp-p is lower than a set value, electrical fault determination unit 13c determines that a ground fault occurs. When a ground fault occurs, blunting of the applied rectangular wave pulse waveform increases. A decrease in calculated differential voltage Vp-p means that blunting of the rectangular wave pulse waveform increases. The set value is determined on the basis of blunting, which is derived in advance by an experiment or simulation by a designer, of the rectangular wave pulse waveform at the time of occurrence of a ground fault.

As described above, in Comparative Example 1, an aluminum electrolytic capacitor is used as coupling capacitor Cc. When the aluminum electrolytic capacitor is left in a no-load state for a long time, characteristic deterioration such as an increase in leakage current is likely to occur. The increase in leakage current occurs when a dielectric film and an electrolyte solution chemically react with each other to decrease a withstand voltage. Further, the increase in leakage current also occurs when oxygen protecting a defective portion of an oxide film diffuses into the electrolyte solution and the electrolyte solution flows into the defective portion. The electrolyte solution of the aluminum electrolytic capacitor can no longer maintain a normal state in a state where no voltage is applied, and is likely to cause the chemical reaction described above. Note that, when the voltage is applied, the state returns to the normal state, but it takes time to return to the normal state.

In a case where no ground fault occurs between a high-voltage vehicle load including inverter 2 and the chassis ground in a state where positive-side main relay MRp and negative-side main relay MRm are off (open), no voltage is applied to coupling capacitor Cc, and no-load state is made. In this state, the leakage current of coupling capacitor Cc tends to increase. In a state where a large leakage current flows through coupling capacitor Cc, even when positive-side main relay MRp and negative-side main relay MRm are turned on (closed) for measuring the electrical fault resistance between the vehicle load and the chassis ground, accurate measurement becomes difficult due to an influence of the leakage current flowing through coupling capacitor Cc.

Therefore, it is conceivable to provide a mechanism that applies a voltage to coupling capacitor Cc even when positive-side main relay MRp and negative-side main relay MRm are in an off state.

Figure 3:
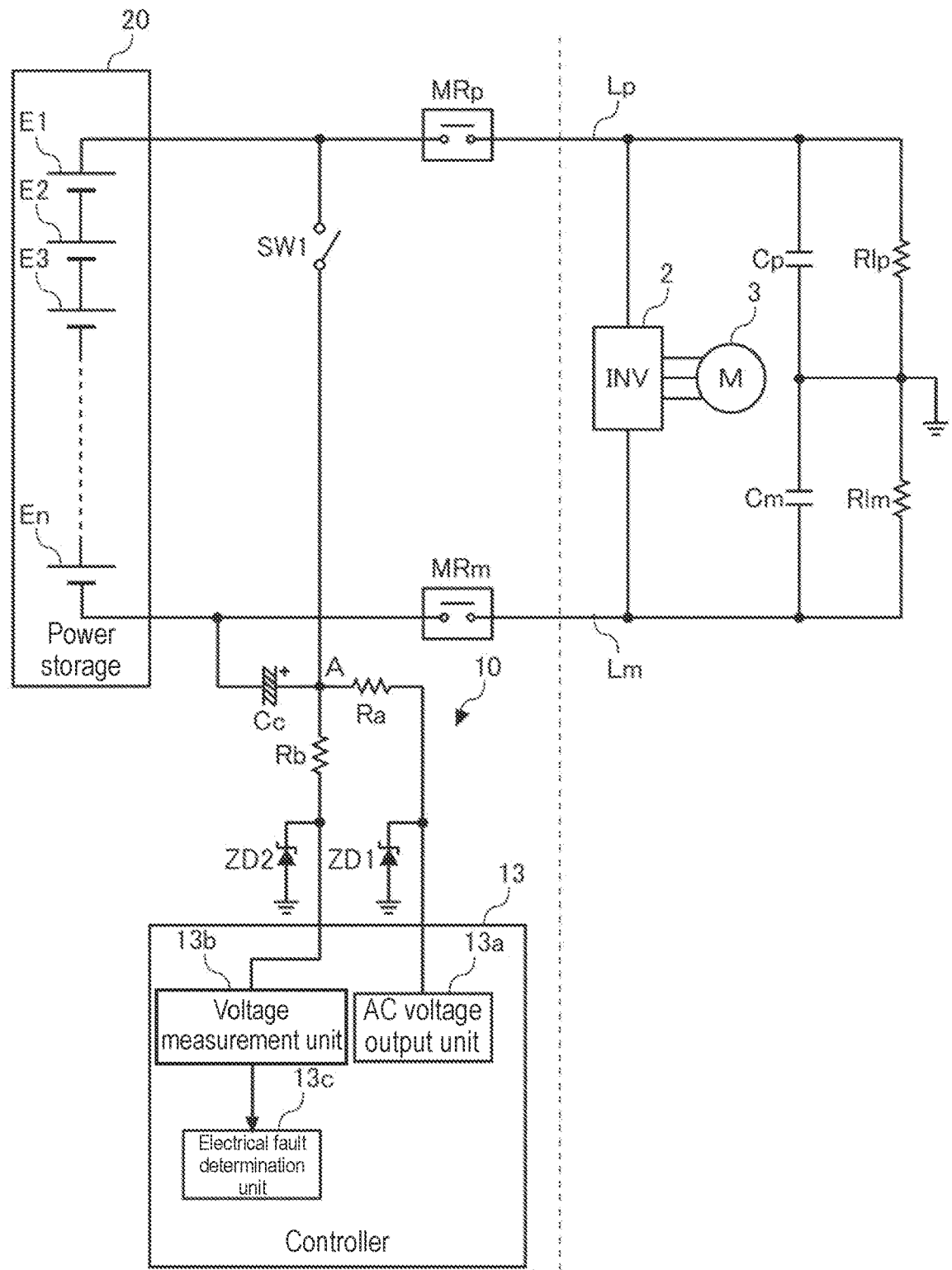
FIG. 3 is a diagram for explaining a configuration of a power supply system including an electrical fault detection device according to Comparative Example 2.

FIG. 3 is a diagram for explaining a configuration of power supply system 5 including electrical fault detection device 10 according to Comparative Example 2. Hereinafter, differences from the configuration of power supply system 5 according to Comparative Example 1 illustrated in FIG. 1 will be described. In Comparative Example 2, switch SW1 is connected between a positive electrode of power storage 20 and measurement point A. In a state where positive-side main relay MRp and negative-side main relay MRm are off, switch SW1 is periodically turned on to apply a voltage to coupling capacitor Cc. This makes it possible to inhibit characteristic deterioration such as an increase in leakage current in an aluminum electrolytic capacitor used for coupling capacitor Cc.

In a state where switch SW1 is turned on, a high voltage side circuit including power storage 20 and a low voltage side circuit including electrical fault detection device 10 are not insulated. Therefore, in Comparative Example 2, safety of electrical fault detection device 10 is lower than safety in Comparative Example 1. In addition, for switch SW1, it is necessary to use a switch (for example, a photo MOS relay) having high insulation performance. The switch having high insulation performance is expensive, which increases a cost of electrical fault detection device 10 according to Comparative Example 2.

Figure 4:
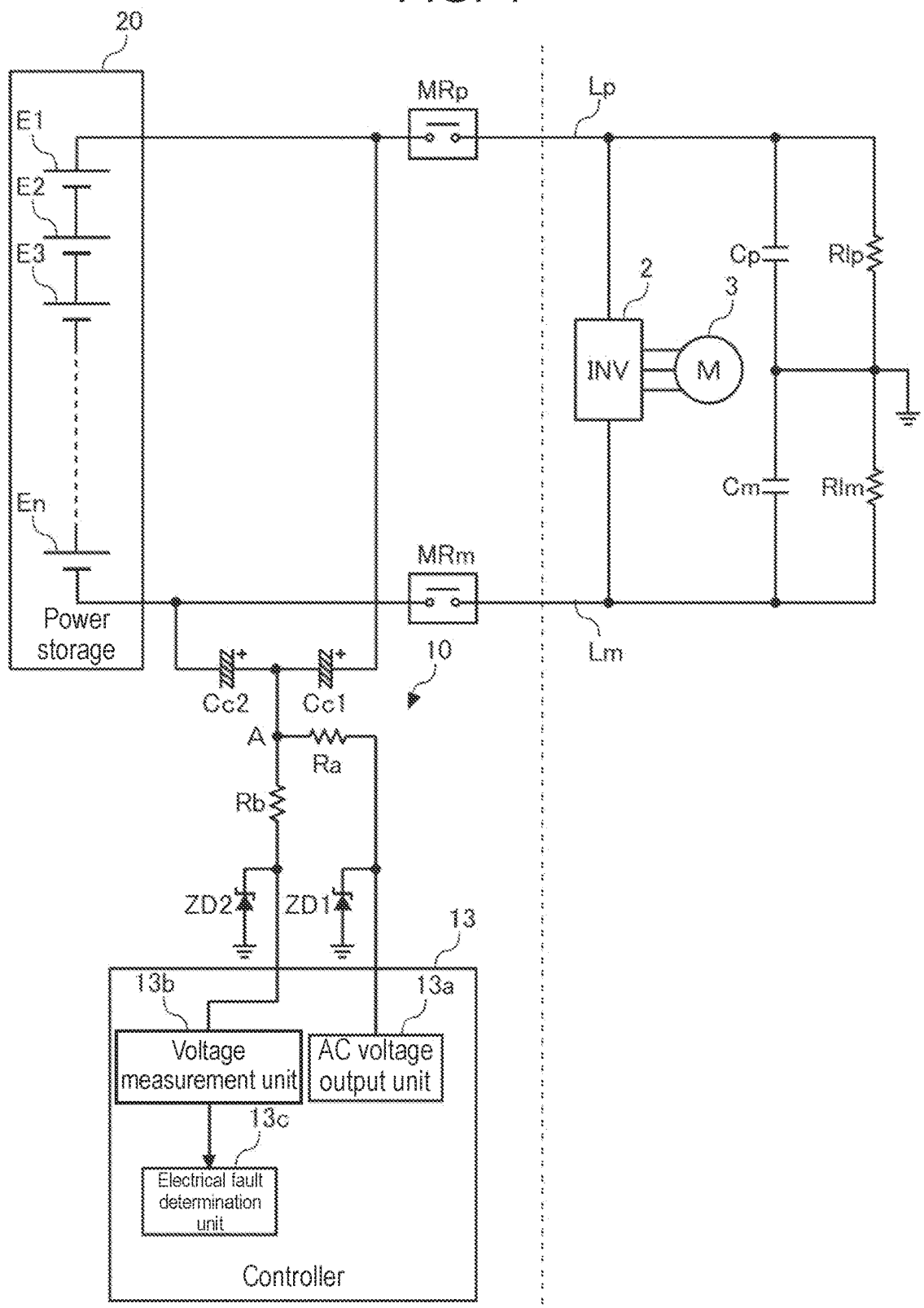
FIG. 4 is a diagram for explaining a configuration of a power supply system including an electrical fault detection device according to an exemplary embodiment of the present invention.

FIG. 4 is a diagram for explaining a configuration of power supply system 5 including electrical fault detection device 10 according to an exemplary embodiment of the present invention. Hereinafter, differences from the configuration of power supply system 5 according to Comparative Example 1 illustrated in FIG. 1 will be described. In the exemplary embodiment, coupling capacitor Cc according to Comparative Example 1 is divided into two, first coupling capacitor Cc1 and second coupling capacitor Cc2. For each of first coupling capacitor Cc1 and second coupling capacitor Cc2, an aluminum electrolytic capacitor is used. Hereinafter, it is assumed that the same aluminum electrolytic capacitor is used for first coupling capacitor Cc1 and second coupling capacitor Cc2. Note that capacities of first coupling capacitor Cc1 and a capacity of second coupling capacitor Cc2 may be uneven.

A positive electrode of first coupling capacitor Cc1 is connected to a positive electrode of power storage 20, a negative electrode of second coupling capacitor Cc2 is connected to a negative electrode of power storage 20, and a negative electrode of first coupling capacitor Cc1 and a positive electrode of second coupling capacitor Cc2 are connected to each other. A connection point between the negative electrode of first coupling capacitor Cc1 and the positive electrode of second coupling capacitor Cc2 is to be measurement point A. In this configuration, regardless of an on or off state of positive-side main relay MRp and negative-side main relay MRm, a voltage is continuously applied to both ends of first coupling capacitor Cc1 and second coupling capacitor Cc2 connected in series.

Note that an AC voltage waveform at measurement point A measured by voltage measurement unit 13b is to be the same as an AC voltage waveform at measurement point A measured in Comparative Example 1. In both Comparative Example 1 and the present exemplary embodiment, the AC waveforms are the same since a DC component is absorbed by coupling capacitor Cc or by first coupling capacitor Cc1 and second coupling capacitor Cc2.

As described above, according to the present exemplary embodiment, coupling capacitor Cc is divided into two, first coupling capacitor Cc1 is connected between the positive electrode of power storage 20 and measurement point A, and second coupling capacitor Cc2 is connected between the negative electrode of power storage 20 and measurement point A. As a result, a voltage is always applied to first coupling capacitor Cc1 and second coupling capacitor Cc2. Therefore, even when an aluminum electrolytic capacitor is used for first coupling capacitor Cc1 and second coupling capacitor Cc2, an increase in leakage current can be suppressed.

By using an aluminum electrolytic capacitor as the coupling capacitor, a large-capacity coupling capacitor can be realized at low cost. In addition, since it is not necessary to use expensive switch SW1 having high insulation performance as in Comparative Example 2, it is possible to suppress an increase in cost due to the addition of switch SW1.

Further, according to the present exemplary embodiment, since the high-voltage side circuit including power storage 20 and the low-voltage side circuit including electrical fault detection device 10 are insulated by first coupling capacitor Cc1 and second coupling capacitor Cc2, safety is higher than the configuration shown in Comparative Example 2.

Further, according to the present exemplary embodiment, first coupling capacitor Cc1 and second coupling capacitor Cc2 are used. Therefore, even if one coupling capacitor has an open failure, another coupling capacitor can maintain a constant electrical fault detection function.

The present invention has been described above on the basis of the exemplary embodiment. The exemplary embodiment is an example, and it is to be understood by those skilled in the art that various modifications can be made to combinations of the individual components and the individual processing processes, and such modifications are also within the scope of the present invention.

In the above-described exemplary embodiment, a description has been given to an example in which the positive electrode of first coupling capacitor Cc1 is connected to the positive electrode of power storage 20, and the negative electrode of second coupling capacitor Cc2 is connected to the negative electrode of power storage 20. In this regard, to two connection points on a current path of a plurality of cells E1 to En connected in series in power storage 20, the positive electrode of first coupling capacitor Cc1 and the negative electrode of second coupling capacitor Cc2 may be individually connected. At that time, among the two connection points, the positive electrode of first coupling capacitor Cc1 is connected to a high potential connection point, and the negative electrode of second coupling capacitor Cc2 is connected to a low potential connection point. Even in such a connection form, an AC voltage waveform at measurement point A measured by voltage measurement unit 13b is to be the same as an AC voltage waveform at measurement point A measured in the above-described exemplary embodiment.

In the above-described exemplary embodiment, a description has been given to an example in which a rectangular wave pulse signal is applied from AC output unit 13a to first coupling capacitor Cc1 and second coupling capacitor Cc2 via resistor Ra. In this regard, a sinusoidal wave signal may be applied to first coupling capacitor Cc1 and second coupling capacitor Cc2. Electrical fault determination unit 13c determines whether or not the current is leaked on the basis of a degree of blunting of the applied sinusoidal wave signal measured at measurement point A.

In the above-described exemplary embodiment, a description has been given to an example in which electrical fault detection device 10 is mounted on an electric vehicle and used. In this regard, electrical fault detection device 10 according to the exemplary embodiment can also be applied to purposes other than in-vehicle applications. As long as a configuration is adopted in which power storage 20 and a load that receives power supply from power storage 20 are insulated from the ground, and power storage 20 and the load are conducted and disconnected by a switch, the load may be any load. For example, the load may be a load used in a railway vehicle.

In the above-described exemplary embodiment, a description has been given to an example in which an aluminum electrolytic capacitor is used for coupling capacitor Cc. In this regard, even in a case of using, as coupling capacitor Cc, a capacitor exhibiting characteristic deterioration similar to characteristic deterioration of the aluminum electrolytic capacitor in a no-load state, the configuration according to the above-described exemplary embodiment can be applied.

The exemplary embodiment may be specified by the following items.

[Item 1]
Electrical fault detection device (10) including:
first coupling capacitor (Cc1) including one cell or a plurality of cells (E1 to En) connected in series, and having a first terminal connected to a first connection point on a current path of power storage (20) in a state of being insulated from a ground;
second coupling capacitor (Cc2) having a second terminal connected to a second connection point on a current path of power storage (20), the second connection point being lower in potential than the first connection point, second coupling capacitor (Cc2) having a first terminal connected to a second terminal of first coupling capacitor (Cc1);
AC output unit (13a) configured to apply a predetermined AC voltage via impedance element (Ra) to third connection point (A) between the second terminal of first coupling capacitor (Cc1) and the first terminal of second coupling capacitor (Cc2);
voltage measurement unit (13b) configured to measure a voltage at third connection point (A); and
determination unit (13c) configured to determine presence or absence of an electrical failure on the basis of a voltage measured by voltage measurement unit (13b).

This makes it possible to suppress an increase in leakage current that may occur in the coupling capacitor.

[Item 2]
Electrical fault detection device (10) according to item 1, in which
first coupling capacitor (Cc1) and second coupling capacitor (Cc2) are aluminum electrolytic capacitors,
each first terminal of first coupling capacitor (Cc1) and second coupling capacitor (Cc2) is a positive electrode terminal, and
each second terminal of first coupling capacitor (Cc1) and second coupling capacitor (Cc2) is a negative electrode terminal.

This makes it possible to suppress an increase in leakage current generated in the aluminum electrolytic capacitor in a no-load state.

[Item 3]
Electrical fault detection device (10) according to item 1 or item 2, in which
the first connection point is a positive electrode of power storage (20), and
the second connection point is a negative electrode of power storage (20).

This makes it possible to provide a connection point with the coupling capacitor outside power storage (20), and facilitates connection of the coupling capacitor.

[Item 4]
Vehicle power supply system (5) including:
power storage (20) mounted in a state of being insulated from a chassis ground of a vehicle, power storage (20) being configured to supply electric power to load (2) in the vehicle;
first switch (MRp) to be inserted in positive wiring (Lp) connected with a positive electrode of power storage (20) and one end of load (2);
second switch (MRm) to be inserted in negative wiring (Lm) connected with a negative electrode of power storage (20) and another end of load (2); and
electrical fault detection device (10) according to item 1 or item 2.

This makes it possible to realize vehicle power supply system (5) including electrical fault detection device (10) in which an increase in leakage current that may occur in the coupling capacitor is suppressed.

REFERENCE MARKS IN THE DRAWINGS 2 inverter
3 motor
5 power supply system
10 electrical fault detection device
3 controller
13a AC output unit
13b voltage measurement unit
13c electrical fault determination unit
20 power storage
E1-En cell
Cc coupling capacitor
Cc1 first coupling capacitor
Cc2 second coupling capacitor
Ra, Rb resistor
SW1 switch
ZD1 first Zener diode
ZD2 second Zener diode
MRp positive-side main relay
MRm negative-side main relay
Lp positive wiring
Lm negative wiring
Cp positive-side Y capacitor
Cm negative-side Y capacitor
Rlp positive-side electrical fault resistance
Rlm negative-side electrical fault resistance

The invention claimed is:

1. An electrical fault detection device comprising:
a first coupling capacitor including a first terminal directly connected to a first connection point on a current path of a power storage, the power storage being in a state of being insulated from a ground;
a second coupling capacitor including a second terminal directly connected to a second connection point on a current path of the power storage, the second connection point being lower in potential than the first connection point, the second coupling capacitor including a first terminal connected to a second terminal of the first coupling capacitor;
an alternating (AC) current output unit configured to apply a predetermined AC voltage via an impedance element to a third connection point between the second terminal of the first coupling capacitor and the first terminal of the second coupling capacitor;
a voltage measurement unit configured to measure a voltage at the third connection point; and
a determination unit configured to determine whether or not the current is leaked, based on a voltage measured by the voltage measurement unit,
wherein the first connection point is a positive electrode of the power storage,
the second connection point is a negative electrode of the power storage, and
the power storage includes only a plurality of cells connected in series.

2. The electrical fault detection device according to claim 1, wherein
the first coupling capacitor and the second coupling capacitor are aluminum electrolytic capacitors,
each first terminal of the first coupling capacitor and the second coupling capacitor is a positive electrode terminal, and
each second terminal of the first coupling capacitor and the second coupling capacitor is a negative electrode terminal.

3. A vehicle power supply system comprising:
a power storage mounted in a state of being insulated from a chassis ground of a vehicle, the power storage being configured to supply power to a load in the vehicle;
a first switch to be inserted in positive wiring connected with a positive electrode of the power storage and one end of the load;
a second switch to be inserted in negative wiring connected with a negative electrode of the power storage and another end of the load; and
the electrical fault detection device according to claim 1.

* * * * *